United States Patent [19]
Takehara

[11] 4,241,313
[45] Dec. 23, 1980

[54] AUDIO POWER AMPLIFIER

[75] Inventor: Takao Takehara, Hamamatsu, Japan

[73] Assignee: Nippon Gakki Seizo Kabushiki Kaisha, Hamamatsu, Japan

[21] Appl. No.: 606,425

[22] Filed: Aug. 21, 1975

Related U.S. Application Data

[63] Continuation-in-part of Ser. No. 409,586, Oct. 25, 1973, abandoned.

[30] Foreign Application Priority Data

| Oct. 27, 1972 | [JP] | Japan | 47-108345 |
| Oct. 27, 1972 | [JP] | Japan | 47-124793[U] |
| Oct. 27, 1972 | [JP] | Japan | 47-124794[U] |
| Oct. 27, 1972 | [JP] | Japan | 47-124795[U] |
| Oct. 27, 1972 | [JP] | Japan | 47-124796[U] |
| Oct. 27, 1972 | [JP] | Japan | 47-124797[U] |

[51] Int. Cl.$^2$ .............................................. H03F 3/16
[52] U.S. Cl. .................................. 330/253; 330/255; 330/264; 330/269; 330/277
[58] Field of Search ............... 179/1 A; 330/253, 255, 330/264, 269, 277

[56] References Cited

U.S. PATENT DOCUMENTS

| 3,376,388 | 4/1968 | Reiffin | 330/13 X |
| 3,392,341 | 7/1968 | Burns | 330/35 X |
| 3,760,288 | 9/1973 | Leonard | 330/13 X |
| 3,862,367 | 1/1975 | Kono et al. | 330/35 X |

*Primary Examiner*—Lawrence J. Dahl
*Attorney, Agent, or Firm*—Cushman, Darby & Cushman

[57] ABSTRACT

An audio power amplifier comprising a first stage voltage amplifier circuit, a second stage voltage amplifier circuit and a last stage power amplifier circuit. The first stage voltage amplifier circuit is of differential amplifier type including a pair of field effect transistors for voltage amplifying an audio frequency signal. The second stage voltage amplifier circuit includes a field effect transistor for voltage amplifying the output signal from the first stage voltage amplifier circuit. The second stage voltage amplifier circuit also serves as a drive stage. The last-stage power amplifier circuit includes a pair of field effect transistors having drain voltage versus drain current characteristics similar to static plate voltage versus plate current characteristics of a triode vacuum tube for power amplifying the output signals of the second stage voltage amplifier circuit.

6 Claims, 10 Drawing Figures

AUDIO POWER AMPLIFIER

This application is a continuation-in-part of the now-abandoned United States application Ser. No. 409,586 filed Oct. 25, 1973, entitled AUDIO POWER AMPLIFIER in the name of TAKAO TAKEHARA.

BACKGROUND OF THE INVENTION

Field of the Invention

This invention relates to audio power amplifiers having a low frequency power amplifier stage constructed with power field-effect transistors having drain voltage versus drain current characteristics similar to static plate voltage versus plate current characteristics of a triode vacuum tube (hereinafter referred to as triode characteristics), this construction permitting to simplify the circuit construction of a drive stage for driving the power amplifier circuit and also obtain production of high quality sounds with high fidelity.

The prior-art audio power amplifiers are roughly classed into two types, namely vacuum tube type and transistor type. The vacuum tube audio power amplifiers include those using pentodes and those using triodes.

Where pentodes are used, high gain and high efficiency can be obtained to obtain high power. In this case, however, problems are encountered in the non-linearility of the pentodes, giving rise to too much odd harmonic distortion in the amplifier output, which is undesired from the acoustical standpoint. Also in this case, an output transformer must be used due to the high internal impedance of the pentode. This also contributes to the generation of distortions. Further, the required use of an output transformer is undesirable from the standpoint of the size and weight of the amplifier unit.

Amplifiers using triodes, on the other hand, provide superior lineality to that of the pentode amplifier, so that less negative feedback is required to reduce the distortion factor. Also, in this case the output transformer can be omitted since the internal impedance of the triode is low compared to the pentode. Further, even harmonic distortion constitutes the majority of the distortion component of the amplifier output. Since they have less adverse acoustical effects, sound of superior quality can be reproduced. However, the internal resistance of the triode is still considerably high although it is low compared to that of the pentode. Also, where the output transformer is omitted, it is necessary to provide negative feed-back to a great extent, giving rise to problems in the transient characteristics.

In addition, in the vacuum tube power amplifier using either pentodes or triodes, heater voltage is required, leading to increased power consumption and imposing restrictions upon the size reduction of the amplifier unit.

In the case of the transistor power amplifier, the reduction of size and weight as well as power consumption are possible to realize. However, the transistor has distortion characteristics similar to those of the pentode, mainly consisting of odd harmonic distortions. Therefore, the quality of the sound reproduced is inferior compared to the case of the triode vacuum tube power amplifier, so that the transistor power amplifier is unsuitable as a high-grade audio power amplifier for obtaining high fidelity sound reproduction. The audio power amplifier units described in the prior art are of significantly different construction as compared to the construction defined by the present invention, and particularly as regards the final stage. Thus, relevant prior art audio power amplifier units characteristically do not describe a final stage including power field effect transistors having drain voltage versus drain current characteristics similar to static plate voltage versus plate current characteristics of a triode vacuum tube. Moreover such art does not describe a second stage voltage amplifier circuit having two outputs, reversed in phase and serving as a drive stage. Self-biased field-effect transistor amplifiers are known; however, such units do not include power field-effect transistors having the aforedescribed triode vacuum tube characteristics connected in the manner to be described in detail hereinafter.

SUMMARY OF THE INVENTION

In the light of the above aspects it is the primary object of the present invention to provide an audio power amplifier, which permits to obtain production of high quality sound with reduced odd harmonic distortion components, as well as permitting the reduction of the circuit construction and featuring small size and light weight constituting the merits of the transistor power amplifier.

Another object of the invention is to provide an audio power amplifier, in which a last-stage power amplifier is constructed with power field-effect transistors (hereinafter referred to as power EFT) having triode characteristics, thereby permitting to construct a previous voltage amplifier stage and a drive stage therefor as a single stage.

A further object of the invention is to provide an audio power amplifier, which comprises a pair of power FET's having triode characteristics and constituting a last-stage power amplifier circuit and an ordinary FET constituting a voltage amplifier circuit serving as drive stage for driving the power amplifier circuit.

A further object of the invention is to provide an audio power amplifier, which comprises voltage amplifier stages all constituted by ordinary FET's and a last-stage power amplifier circuit constituted by a pair of power FET's having triode characteristics.

A further object of the invention is to provide an audio power amplifier, which comprises a phase inversion and drive stage consisting of pair transistors in complementary symmetry connection and a last-stage power amplifier circuit consisting of pair power FET's having triode characteristics also in complementary symmetry connection.

A further object of the invention is to provide an audio power amplifier, which comprises a first-stage voltage amplifier circuit consisting of pair transistors in complementary symmetry connection, a drive stage also consiting of pair transistors in complementary symmetry connection and a last-stage power amplifier consisting of pair power FET's having triode characteristics also in complementary symmetry connection.

A yet further object of the invention is to provide an audio power amplifier, which comprises a drive stage and last-stage power amplifier circuit, each said stage consisting of pair FET's having triode characteristics. The foregoing objects are attained in accordance with the invention which in its broader aspects provides an audio power amplifier comprising a first-stage voltage amplifier circuit of differential amplifier type including a pair of field-effect transistors for voltage amplifying an audio frequency signal, a second-stage voltage amplifier circuit including a field-effect transistor for voltage amplifying the output signal from said first-stage voltage amplifier circuit said second-stage voltage amplifier circuit also serving as a drive stage, and a last-stage power amplifier circuit including a pair of field-effect transistors having drain voltage versus drain current characteristics similar to static plate voltage versus plate current characteristics of a triode vacuum tube for power amplifying the output signals of said second-stage voltage amplifier circuit.

In a preferred embodiment of the invention, the second stage amplifier circuit includes an n-p-n transistor and p-n-p transistor connected in complementary symmetry form for phase inverting the output signal of the first stage amplifier circuit and the last-stage power amplifier circuit includes a pair of p-channel and n-channel power field effect transistors having the aforedescribed triode characteristics connected in complementary symmetry form for power amplifying the output signal from the n-p-n transistor being adapted to drive the p-channel power field-effect transistor and the output signal from the p-n-p transistor is adapted to drive the n-channel power field effect transistor.

In a further preferred embodiment, the first stage amplifier circuit includes an n-p-n transistor and a p-n-p transistor connected in complementary symmetry form for amplifying an audio frequency signal, the second stage amplifier circuit is connected to the output side of the first stage amplifier circuit, said second stage including a second n-p-n transistor and a second p-n-p transistor connected in complementary symmetry form and a last-stage power amplifier circuit including a p-channel power field-effect transistor and an n-channel power field-effect transistor connected in complementary symmetry form for amplifying the output signals of the second stage amplifier circuit and wherein the output signal from the second n-p-n transistor is adapted to drive the p-channel power field-effect transistor and the output signal from the second p-n-p transistor is adapted to drive the n-channel power field effect transistor.

According to yet another preferred embodiment of the invention, the second stage amplifier circuit includes a p-channel field-effect transistor and an n-channel field-effect transistor having the aforedescribed triode characteristics connected in complementary symmetry form for amplifying the output signal from the first stage amplifier circuit, the last stage power amplifier circuit includes a p-channel power field-effect transistor and an n-channel power field-effect transistor having the aforedescribed triode characteristics connected in complementary symmetry form for power amplifying the output signal from the p-channel field-effect transistor being adapted to drive the p-channel power field-effect transistor, the output signal from the n-channel field-effect transistor being adapted to drive the n-channel power field-effect transistor.

Other aspects and embodiments of the invention will become more apparent hereinafter as the description proceeds.

The features which are believed to be novel and characteristic of this invention are set forth with particularly in the appended claimed. The invention itself, however, together with the further objects and advantages thereof, will be best understood from the following description taken in conjunction with the accompanying drawings which illustrates, by way of example only, some preferred embodiments of the invention and throughout which like reference characters designate like parts.

DESCRIPTION OF THE PREFERRED EMBODIMENTS

Figure 1:
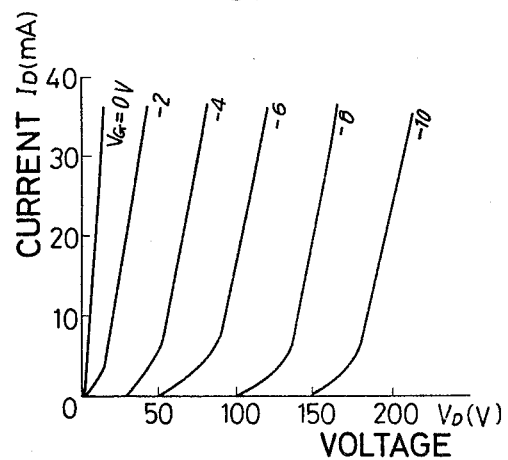
FIG. 1 shows drain voltage versus drain current characteristics of a power FET used for the audio power amplifier according to the invention.

FIG. 1 shows static drain voltage ($V_D$) versus drain current ($I_D$) characteristics of a field-effect transistor used for the audio power amplifier according to the invention, the characteristics being similar to static plate voltage versus plate current characteristics of a triode vacuum tube.

Figure 2:
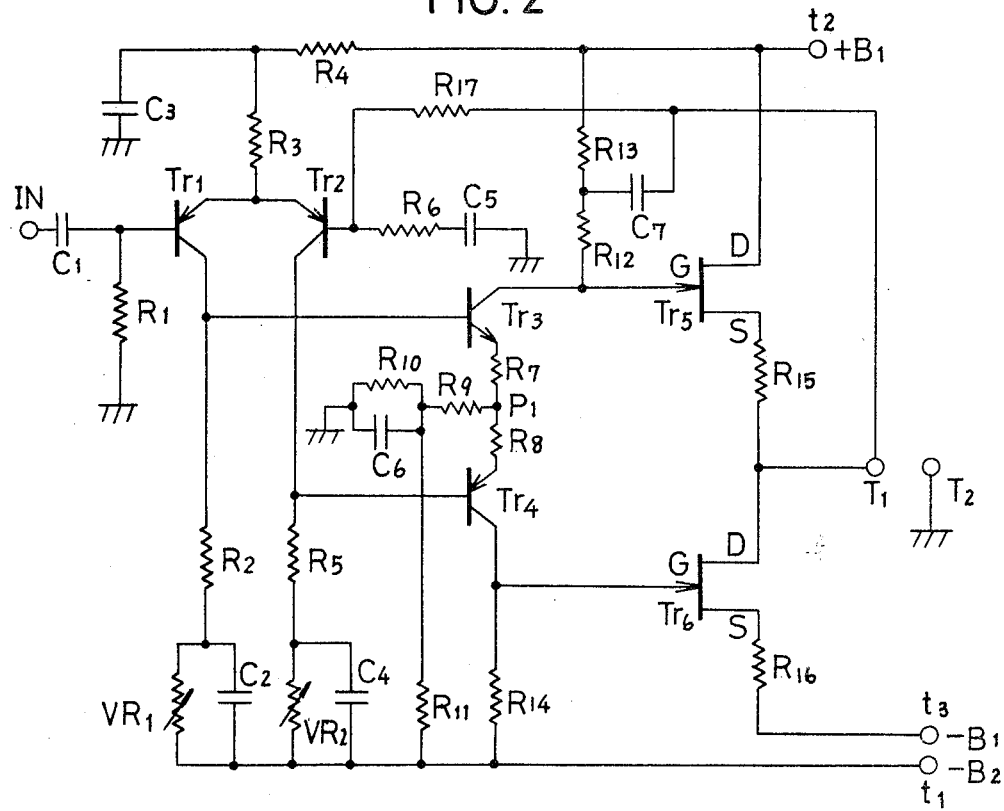
FIG. 2 is a circuit diagram showing a first embodiment of the audio power amplifier according to the invention.

FIG. 2 shows an audio power amplifier embodying the invention. It is constructed by using field-effect transistors (hereinafter referred to as FET) having the afore-mentioned triode characteristics. In the Figure, reference symbol IN designates an input terminal, to which an audio frequency signal is coupled.

The input terminal IN is connected through a capacitor 2 $C_1$ to the base of a transistor $Tr_1$. The base of this transistor is also connected through a resistor $R_1$ to earth.

The transistor $Tr_1$ has its collector connected through a resistor $R_2$ and a parallel circuit of variable resistor $VR_1$ and capacitor $C_2$ to a terminal $t_1$, which is held at a potential $-B_2$.

The emitter of the transistor $Tr_1$ is directly connected to the emitter of another transistor $Tr_2$, the transistors $Tr_1$ and $Tr_2$ constituting a first-stage voltage amplifier circuit of differential amplifier type.

Both the transistors $Tr_1$ and $Tr_2$ have their emitter connected commonly through resistors $R_3$ and $R_4$ to a terminal $t_2$, which is held at a potential $+B_1$. The connection between the resistors $R_3$ and $R_4$ is connected through a capacitor $C_3$ to earth.

The transistor $Tr_2$ has its collector connected through a resistor $R_5$ and a parallel circuit of variable resistor $VR_2$ and capacitor $C_4$ to the terminal $t_1$, and its base is connected through a series circuit of resistor $R_6$ and capacitor $C_5$ to earth.

The collector of the transistors $Tr_1$ and $Tr_2$ is also connected directly to the base of respective transistors $Tr_3$ and $Tr_4$.

The transistor $Tr_3$ and $Tr_4$ have their emitters respectively connected to resistors $R_7$ and $R_8$, which are connected to each other at point $P_1$, which is in turn connected to a resistor $R_9$ connected through a parallel circuit of resistor $R_{10}$ and capacitor $C_6$ to earth and also through a resistor $R_{11}$ to the terminal $t_1$.

As is shown, the transistor $Tr_3$ is an n-p-n transistor, while the transistor $Tr_4$ is a p-n-p transistor. These transistors $Tr_3$ and $Tr_4$ constitute a second-stage voltage amplifier circuit serving both as phase inversion stage and drive stage.

The transistor $Tr_3$ has its collector connected through resistors $R_{12}$ and $R_{13}$ in series with each other to the terminal $t_2$, and the transistor $Tr_4$ has its collector connected through a resistor $R_{14}$ to the terminal $t_1$. The collector of both these transistors $Tr_3$ and $Tr_4$ is also connected to the gate of respective power field-effect transistors $Tr_5$ and $Tr_6$ (hereinafter referred to as power FET) having triode characteristics.

The power FET's $Tr_5$ and $Tr_6$ having triode characteristics constitute a last-stage power amplifier circuit the power $Tr_5$ having triode characteristics has its drain connected directly to the terminal $t_2$ and its source connected through a resistor $R_{15}$ to an output terminal $T_1$. The power FET $Tr_6$ having triode characteristics has its drain connected directly to the output terminal $T_1$ and its source connected through a resistors $R_{16}$ to a terminal $t_3$, which is held at a potential $-B_1$.

The output appearing between the output terminal $T_1$ and another output terminal $T_2$ which is grounded is taken out as output signal.

The output terminal $T_1$ is connected through a resistor $R_{17}$ to the base of the transistor $Tr_2$ for providing negative feedback to the main loop, and it is also connected through a capacitor $C_7$ to the connection point between the resistors $R_{12}$ and $R_{13}$ for forming a bootstrap loop (for positive feed-back).

The variable resistors $VR_1$ and $VR_2$ permit the adjustment of the d-c level of the output appearing between the output terminals $T_1$ and $T_2$. More particularly, they permit to vary the base bias potentials on the transistors $Tr_3$ and $Tr_4$ for adjusting the zero level of d-c component of the output signal.

The resistance of the series circuit of resistors $R_{12}$ and $R_{13}$ and that of the resistor $R_{14}$ are suitably selected to appropriately bias the gate of the power FET's $Tr_5$ and $Tr_6$ having triode characteristics. The potential $-B_2$ on the terminal $t_1$ is made more negative than the potential $-B_1$ on the terminal $t_3$ since the gate potential on the power FET $Tr_6$ having triode characteristics must be lower than the source potential.

With the audio power amplifier of the above construction according to the invention, an audio frequency signal coupled to the input terminal IN is first voltage amplified through the first-stage voltage amplifier circuit of transistors $Tr_1$ and $Tr_2$ constituting a differential amplifier.

The output signals appearing at the collector of the transistors $Tr_1$ and $Tr_2$ are respectively coupled to the base of the transistors $Tr_3$ and $Tr_4$ constituting the second-stage voltage amplifier circuit for further voltage amplification and phase inversion.

The phase inversion output signals appearing at the collector of the transistors $Tr_3$ and $Tr_4$ are respectively coupled as drive signal to the gate of the power FET's $Tr_5$ and $Tr_6$ having triode characteristics and constituting the last-stage power amplifier circuit. In this way, the audio frequency signal is power amplified.

The output of the power amplifier stage appearing at the output terminal $T_1$ is coupled as negative feedback signal through the resistor $R_{17}$ to the transistor $Tr_2$, and it is also used to provide bootstrap through the circuit of capacitor $C_7$ and resistor $R_{12}$ to the transistor $Tr_3$.

The power amplified audio frequency signal thus appearing between the output terminals $T_1$ and $T_2$ is less subject to odd harmonic distortions because the power FET's $Tr_5$ and $Tr_6$ in the power amplifier stage have characteristics similar to those of a triode vacuum tube.

While in the above embodiment a differential amplifier constituted by a pair of transistors $Tr_1$ and $Tr_2$ is used as the first-stage voltage amplifier circuit, this is by no means limitative, and a usual transistor amplifier may be used for this state as well. Also, this voltage amplifier circuit may consist of two differential amplifier stages.

Figure 3:
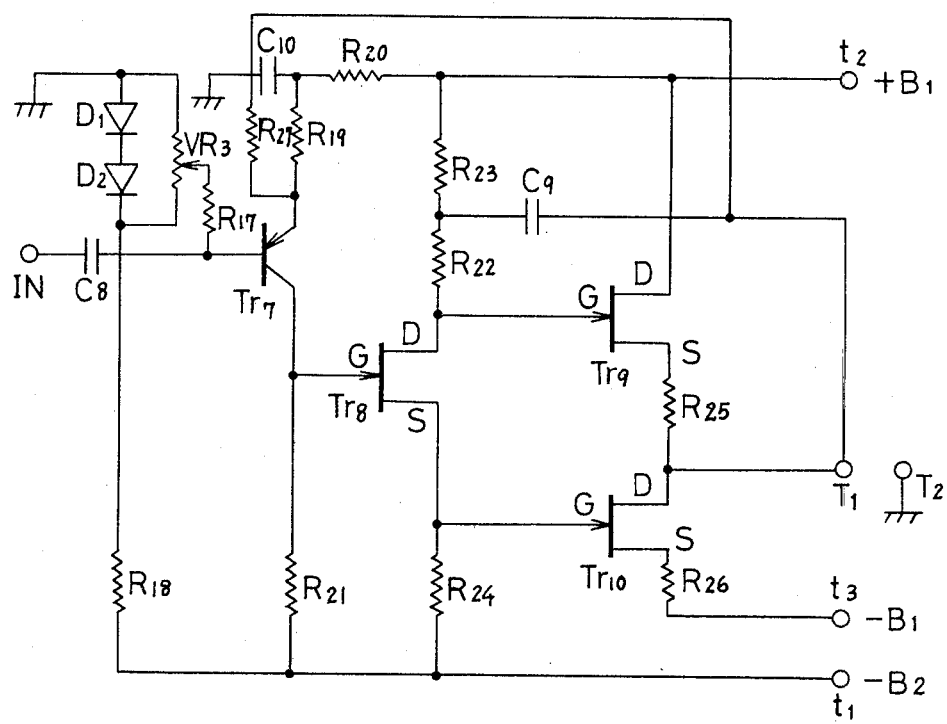
FIG. 3 is a circuit diagram showing a second embodiment of the audio power amplifier according to the invention.

FIG. 3 shows a second embodiment of the invention. In the Figure, reference symbol IN designates an input terminal, to which an audio frequency signal is added.

The input terminal IN is connected through a capacitor $C_8$ to the base of a transistor $Tr_7$. The base of this transistor is also connected to a movable terminal of a variable resistor $VR_3$.

The variable resistor $VR_3$ is parallel with a series diode circuit consisting of two series diodes $D_1$ and $D_2$. The diode $D_1$ has its anode side connected to earth and its cathode side connected to the anode side of the diode $D_2$, whose cathode side is connected through a resistor $R_{18}$ to the terminal $t_1$.

The emitter of the transistor $Tr_7$ is connected through resistors $R_{19}$ and $R_{20}$ in series with each other to terminal $t_2$ the connection between the resistors $R_{19}$ and $R_{20}$ being connected through a capacitor $C_{10}$ to earth.

The collector of the transistor $Tr_7$ is connected through a resistor $R_{21}$ to the terminal $t_1$. It is also connected directly to the gate of an ordinary field-effect transistor (hereinafter referred to as FET) $Tr_8$.

The transistor $Tr_7$ constitutes a first-stage voltage amplifier circuit, and the FET $Tr_8$ constitutes a second-stage voltage amplifier circuit. The FET $Tr_8$ serves both as phase inverter and as drive stage.

The drain of the FET $Tr_8$ is connected through resistors $R_{22}$ and $R_{23}$ in series with each other to the terminal $t_2$, and it is also connected directly to the gate of a power FET $Tr_9$ having triode characteristics.

The source of the FET $Tr_8$ is connected through a resistor $R_{24}$ to the terminal $t_1$, and it is also connected directly to the gate of a power FET $Tr_{10}$ having triode characteristics.

The power FET's $Tr_9$ and $Tr_{10}$ constitute a last-stage push-pull power amplifier circuit. The power FET $Tr_9$ has its drain connected to the terminal $t_2$ and its source connected through a resistor $R_{25}$ to output terminal $T_1$, and the power FET $Tr_{10}$ has its drain connected directly to the output terminal $T_1$ and its source connected through a resistor $R_{26}$ to terminal $t_3$.

The output of the power amplifier circuit of power FET's $Tr_9$ and $Tr_{10}$ appears as power amplified audio frequency signal between the output terminal $T_1$ and grounded output terminal $T_2$.

The output terminal $T_1$ is connected through a resistor $R_{27}$ to the emitter of the transistor $Tr_7$ of the first-stage voltage amplifier circuit for providing a negative feed-back to the main loop, and it is also connected through a capacitor $C_9$ to the connection point between the resistors $R_{22}$ and $R_{23}$ for forming a bootstrap circuit.

The variable resistor $VR_3$ is provided for presetting the base bias on the transistor $Tr_7$. By appropriately setting the base bias voltage the adjustment of the zero level of the d-c component of the output signal appearing between the output terminals $T_1$ and $T_2$ may be made. The diodes $D_1$ and $D_2$ are provided for stabilizing the voltage applied across the variable resistor $VR_3$.

With the audio power amplifier of the above construction according to the invention, an audio frequency signal coupled to the input terminal IN goes to the base of the transistor $Tr_7$ for voltage amplification.

The output signal appearing at the collector of the transistor $Tr_7$ is coupled to the gate of the FET $Tr_8$ for further voltage amplification.

An output appearing from the drain of the FET $Tr_8$ and in the opposite phase as the audio frequency input to the gate of this transistor is coupled to the gate of the power FET $Tr_9$ having triode characteristics. At the same time an output appearing from the source of the FET $Tr_8$ and in the same phase with the audio frequency input to the gate of this transistor is coupled to the gate of the power FET $Tr_{10}$. Thus, it will be seen that the FET $Tr_8$ also serves to drive the power FET's $Tr_9$ and $Tr_{10}$.

With the audio frequency inputs to the power FET's $Tr_9$ and $Tr_{10}$ constituting the power amplifier stage, the output from this stage appears at the output terminal $T_1$, and it is coupled as negative feed-back signal through the resistor $R_{27}$ to the transistor $Tr_7$ and also as bootstrap through the capacitor $C_9$ and resistor $R_{22}$ to the FET $Tr_8$.

The power amplified audio frequency signal thus appearing between the output terminals $T_1$ and $T_2$ is less subject to add harmonic distortions because the power FET's $Tr_9$ and $Tr_{10}$ constituting the power amplifier stage have characteristics similar to those of a triode vacuum tube.

Figure 4:
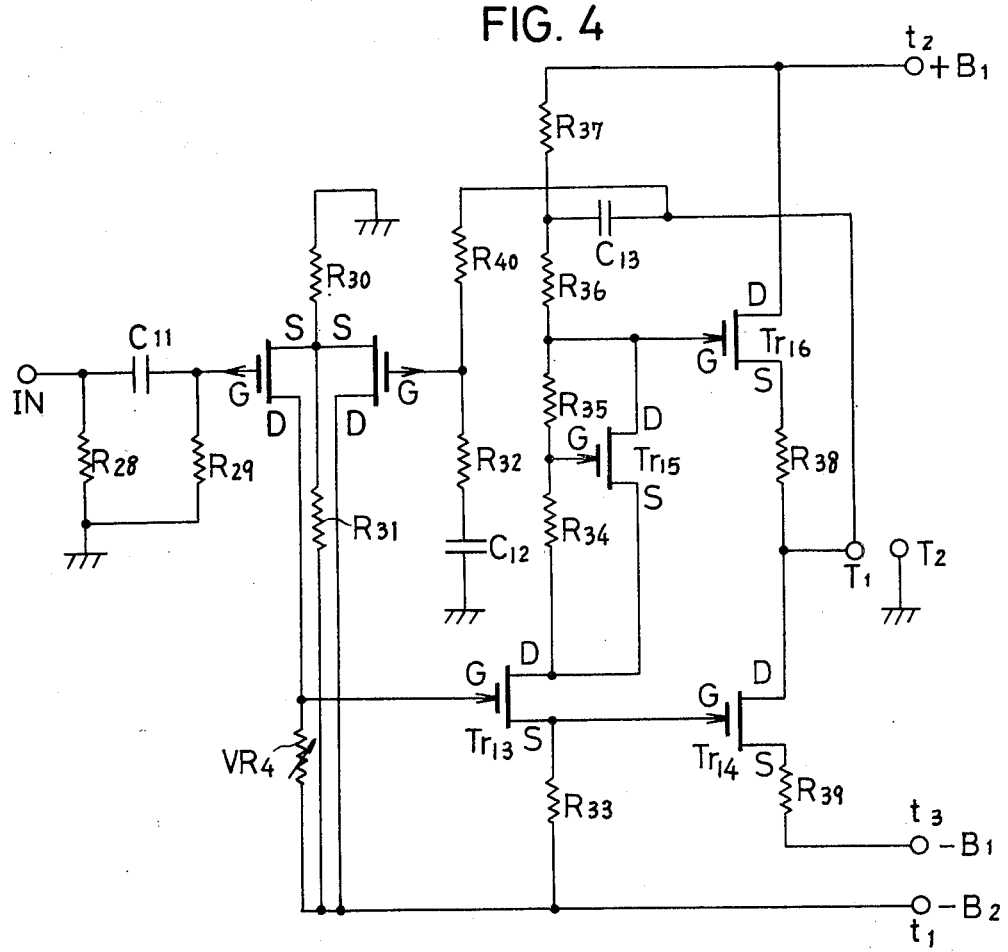
FIG. 4 is a circuit diagram showing a third embodiment of the audio power amplifier according to the invention.

FIG. 4 shows a third embodiment of the invention. In the Figure, reference symbol IN designates an input terminal, to which an audio frequency signal is coupled, and which is connected through a capacitor $C_{11}$ to the gate of a p-channel FET $Tr_{11}$. The gate of this transistor is also connected through a resistor $R_{29}$ to earth, and the input terminal IN is also connected through a resistor $R_{28}$ to earth.

The source of the FET $Tr_{11}$ is directly connected to the source of a similar p-channel FET $Tr_{12}$, and these sources are commonly connected through a resistor $R_{30}$ to earth, and also they are connected through a resistor $R_{31}$ to terminal $t_1$.

As is apparent from the Figure, these two FET's $Tr_{11}$ and $Tr_{12}$ form a differential amplifier, and they constitute a first stage voltage amplifier circuit. The FET $Tr_{11}$ has its drain connected through a variable resistor $VR_4$ to the terminal $t_1$, while the FET $Tr_{12}$ has its drain directly connected to the terminal $t_1$.

The FET $Tr_{12}$ has its gate connected through a series circuit of resistor $R_{32}$ and capacitor $C_{12}$ to earth. The drain of the FET $Tr_{11}$ is directly connected to the gate of an n-channel FET $Tr_{13}$.

The FET $Tr_{13}$ constitutes a second-stage voltage amplifier circuit, and it also serves as drive stage. Its source is connected through a resistor $R_{33}$ to the terminal $t_1$ and also connected directly to the gate of a power FET $Tr_{14}$ having triode characteristics to be described hereinafter and its drain is connected through a series circuit of resistors $R_{34}$ to $R_{37}$ to terminal $t_2$.

The connection between the resistors $R_{34}$ and $R_{35}$ is connected to the gate of an FET $Tr_{15}$. The FET $Tr_{15}$ is provided for temperature compensation. Its source is connected directly to the drain of the FET $Tr_{13}$, and its drain connected to the gate of another power FET $Tr_{16}$ having triode characteristics.

The two power FET $Tr_{14}$ and $Tr_{16}$ having triode characteristics constitute a last-stage power amplifier circuit. The power FET $Tr_{16}$ has its drain connected directly to the terminal $t_2$ and its source connected through a resistor $R_{38}$ to output terminal $T_1$. The power FET $Tr_{14}$ has its drain connected directly to the output terminal $T_1$ and its source connected through a resistor $R_{39}$ to terminal $t_3$.

The output of the power amplifier circuit consisting of the power FET's $Tr_{14}$ and $Tr_{16}$ appears as power amplified audio frequency signal between the output terminal $T_1$ and the grounded output terminal $T_2$. The output terminal $T_1$ is connected through a resistor $R_{40}$ to the gate of the FET $Tr_{12}$ for providing a negative feed-back, and it is also connected through a capacitor $C_{13}$ to the connection point between the resistors $R_{36}$ and $R_{37}$ for providing a bootstrap.

The variable resistor $VR_4$ is provided for pre-setting the gate bias voltage on the FET $Tr_{13}$. By appropriately setting this gate bias voltage the adjustment of the zero level of the d-c component of the output signal appearing between the output terminals $T_1$ and $T_2$ may be made.

With the audio power amplifier of the above construction according to the invention, an audio frequency signal coupled to the input terminal IN goes to the gate of the FET $Tr_{11}$ for voltage amplification through the differential amplifier state consisting of the FET's $Tr_{11}$ and $Tr_{12}$.

The output signal from the differential amplifier stage appearing at the source of the FET $Tr_{11}$ is coupled to the gate of the FET $Tr_{13}$ constituting the second-stage voltage amplifier circuit for further voltage amplification.

The output appearing from the source of the FET $Tr_{13}$ is coupled to the gate of the power FET $Tr_{14}$. At the same time, the output appearing at the drain of the FET $Tr_{13}$ is coupled through the resistors $R_{34}$ and $R_{35}$ to the gate of the other power FET $Tr_{16}$. It will be seen that the FET $Tr_{13}$ serves both to voltage amplify the output from the FET $Tr_{11}$ and drive the power FET's $Tr_{14}$ and $Tr_{16}$.

With the audio frequency inputs to the power FET's $Tr_{14}$ and $Tr_{16}$ constituting the power amplifier stage, the output from this stage appears at the output terminal $T_1$, and it is coupled as negative feed-back signal through the resistor $R_{40}$ to the FET $Tr_{12}$ and also as bootstrap through the capacitor $C_{13}$ and resistors $R_{36}$, $R_{35}$ and $R_{34}$ to the FET $Tr_{13}$.

The power amplified audio frequency signal thus appearing between the output terminals $T_1$ and $T_2$ is less subject to odd harmonic distortions because the power FET's $Tr_{16}$ constituting the power amplifier stage have characteristics similar to those of a triode vacuum tube.

Figure 5:
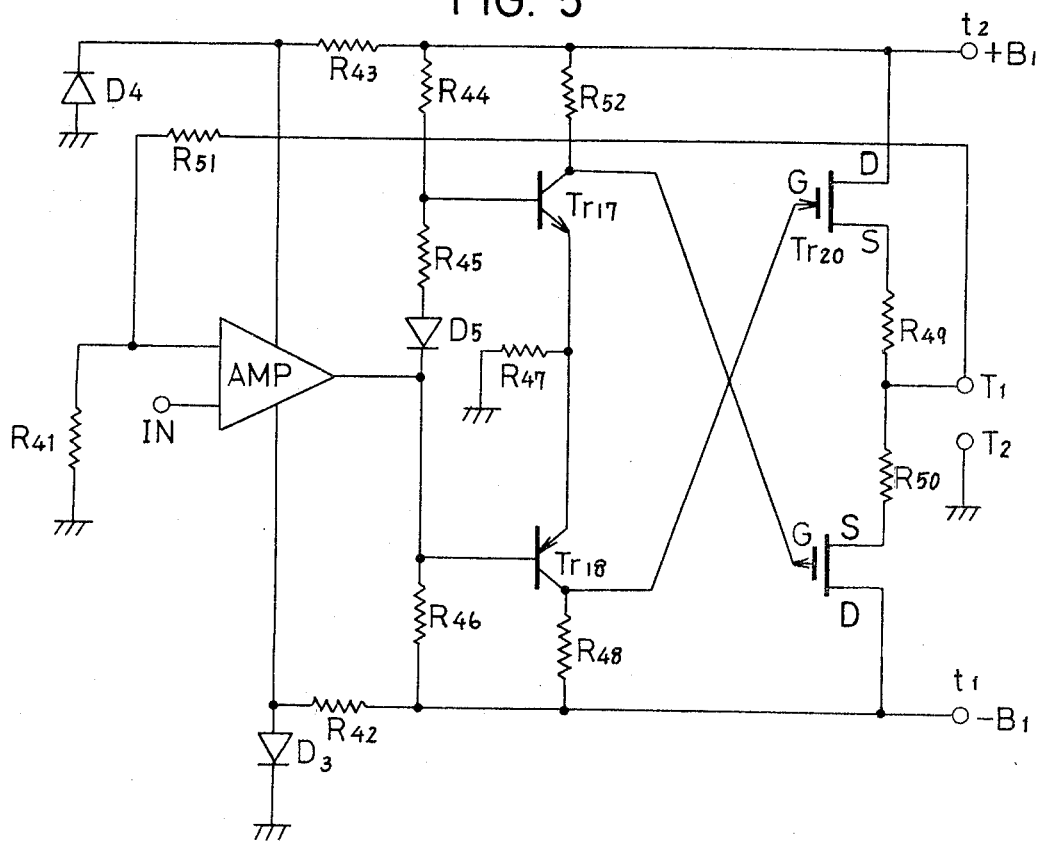
FIG. 5 is a circuit diagram showing a fourth embodiment of the audio power amplifier according to the invention.

FIG. 5 shows a fourth embodiment of the invention. In the Figure, reference symbol IN designates an input terminal, to which an audio frequency signal is coupled. The input terminal IN is connected to one of pair input terminals of an operational amplifier AMP, whose other input terminal is connected through a resistor $R_{41}$ to earth. The operational amplifier AMP also has pair power supply terminals, the negative power supply terminal being connected through a diode $D_3$ to earth and positive power supply terminal being connected through a diode $D_4$ to earth. The negative and positive power supply terminals of the operational amplifier AMP are also connected through respective resistors $R_{42}$ and $R_{43}$ to respective terminals $t_1$ and $t_2$.

Between the terminals $t_1$ and $t_2$, a series circuit consisting of resistors $R_{44}$ and $R_{45}$, a diode $D_5$ and resistor $R_{46}$ is connected. The connection point between resistor $R_{46}$ and diode $D_5$ is connected to an output terminal of the operational amplifier AMP.

The connection point between resistors $R_{44}$ and $R_{45}$ is connected to the base of an n-p-n transistor $Tr_{17}$, and the connection point between diode $D_5$ and resistor $R_{46}$ is connected to the base of a p-n-p transistor $Tr_{18}$. The emitters of both the transistors $Tr_{17}$ and $Tr_{18}$ are commonly connected through a resistor $R_{47}$ to earth.

The collector of the transistor $Tr_{17}$ is connected through a resistor $R_{52}$ to the terminal $t_2$, and the collector of the transistor $Tr_{18}$ is connected through a resistor $R_{48}$ to the terminal $t_1$. With the transistors $Tr_{17}$ and $Tr_{18}$ connected in complementary symmetry in this way, they form a second-stage amplifier circuit serving both as phase inversion stage and drive stage.

The collector of the transistor $Tr_{17}$ is connected to the gate of a p-channel power FET $Tr_{19}$ having triode characteristics, and the collector of the transistor $Tr_{18}$ is connected to the gate of an n-channel power FET $Tr_{20}$ also having triode characteristics.

The power FET $Tr_{20}$ has its drain connected to terminal $t_2$ and its source connected through a resistor $R_{49}$ to output terminal $T_1$. The power FET $Tr_{19}$ has its source connected through a resistor $R_{50}$ to the output terminal $T_1$ and its drain connected to terminal $t_1$. The two power FET's $Tr_{19}$ and $Tr_{20}$ having triode characteristics and connected in complementary symmetry in this way form a last-stage power amplifier circuit.

The output of this power amplifier circuit appears between the output terminal $T_1$ and grounded output terminal $T_2$. The output terminal $T_1$ is connected through a resistor $R_{51}$ to the aforementioned other input terminal of the operational amplifier AMP for negative feed-back.

With the audio power amplifier of the above construction an audio frequency signal coupled to the input terminal IN is first amplified through the operational amplifier AMP.

The output from the operational amplifier AMP is coupled through the diode $D_5$ and resistor $R_{45}$ to the base of the transistor $Tr_{17}$, and also directly to the base of the transistor $Tr_{18}$, for further voltage amplification and phase inversion.

The phase inversion output signals appearing at the collector of the transistors $Tr_{17}$ and $Tr_{18}$ are respectively coupled as drive signal to the gate of the power FET's $Tr_{19}$ and $Tr_{20}$. In this way, the audio frequency signal is power amplified.

The output signal of the power amplifier stage consisting of the power FET's $Tr_{19}$ and $Tr_{20}$ appears at the output terminal $T_1$, and it is coupled as negative feedback signal through the resistor $R_{51}$ to the operational amplifier AMP.

The power amplified audio frequency signal thus appearing between the output terminals $T_1$ and $T_2$ is less subject to odd harmonic distortions because the power FET's $Tr_{19}$ and $Tr_{20}$ constituting the power amplifier stage have characteristics similar to those of a triode vacuum tube. The reduction of the odd harmonic distortions is further enhanced with the complementary symmetry connection of the second-stage and last-stage amplifier circuits, so that sound of very high quality can be reproduced from a loud-speaker connected between the output terminals $T_1$ and $T_2$.

Figure 6:
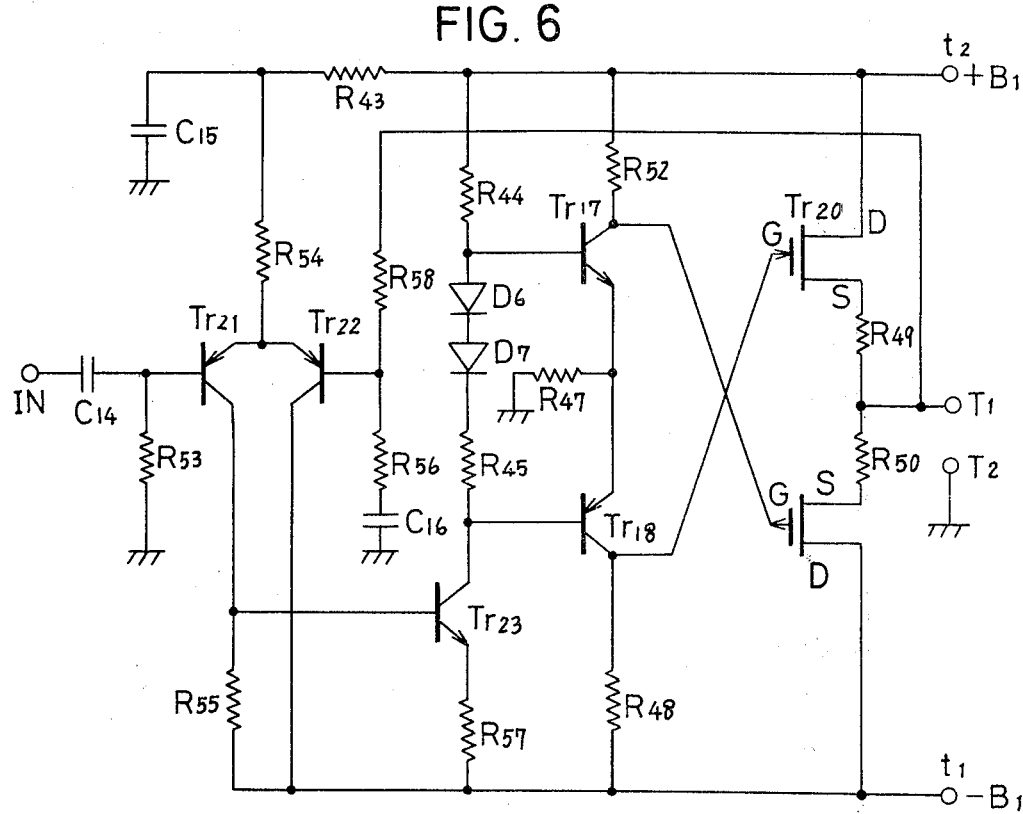
FIG. 6 is a circuit diagram showing a fifth embodiment of the audio power amplifier according to the invention.

FIG. 6 shows a modification of the preceding embodiment of FIG. 5. In the Figure, like parts as those in FIG. 5 are designated by like reference symbols and are not described in any further.

In this embodiment, a differential amplifier consisting of pair transistors $Tr_{21}$ and $Tr_{22}$ is used as a first-stage amplifier circuit in place of the operational amplifier AMP in the embodiment of FIG. 5. The base of the transistor $Tr_{21}$ is connected through a capacitor 14 to input terminal IN, and it is also connected through a resistor $R_{53}$ to earth.

The transistors $Tr_{21}$ and $Tr_{22}$ have their emitters commonly connected through resistors $R_{54}$ and $R_{43}$ to terminal $t_2$, the connection point between the resistors $R_{54}$ and $R_{43}$ being connected through a capacitor $C_{15}$ to earth.

The transistor $Tr_{21}$ has its collector connected through a resistor $R_{55}$ to terminal $t_1$, and the transistor $Tr_{22}$ has its collector connected directly to the terminal $t_1$ and its base connected through a series circuit of resistor $R_{56}$ and capacitor $C_{16}$ to earth.

The collector of the transistor $Tr_{21}$ is also connected to the base of a transistor $Tr_{23}$. This transistor $Tr_{23}$ is provided for phase inversion. Its emitter is connected through a resistor $R_{57}$ to the terminal $t_1$, and its collector is connected through a series circuit of resistor $R_{45}$, diodes $D_6$ and $D_7$ and resistor $R_{44}$ to terminal $t_2$. The diodes $D_6$ and $D_7$ are provided for temperature compensation.

The collector of the transistor $Tr_{23}$ is also connected to the base transistor $Tr_{18}$, and the connection point between resistor $R_{44}$ and diode $D_6$ is connected to the base of a transistor $Tr_{17}$.

With the above construction, an audio frequency signal coupled to the input terminal IN is voltage amplified through the first-stage amplifier circuit consisting of the transistors $Tr_{21}$ and $Tr_{22}$.

The output of this stage appearing from the collector of the transistor $Tr_{21}$ is coupled to the base of the transistor $Tr_{23}$ for phase inversion.

The phase inverted output signal appearing from the collector of the transistor $Tr_{23}$ is coupled through resistor $R_{45}$ and diodes $D_7$ and $D_6$ to the base of the transistor $Tr_{17}$, while it is also coupled directly to the base of the transistor $Tr_{18}$.

The phase inverted signal thus coupled to the bases of the transistors $Tr_{17}$ and $Tr_{18}$ are amplified in the same way as is described before in connection with the previous embodiment of FIG. 5, so that the power amplified audio frequency signal from the power amplifier circuit of the power FET's $Tr_{19}$ and $Tr_{20}$ having triode characteristics appears at the output terminal $T_1$.

Figure 7:
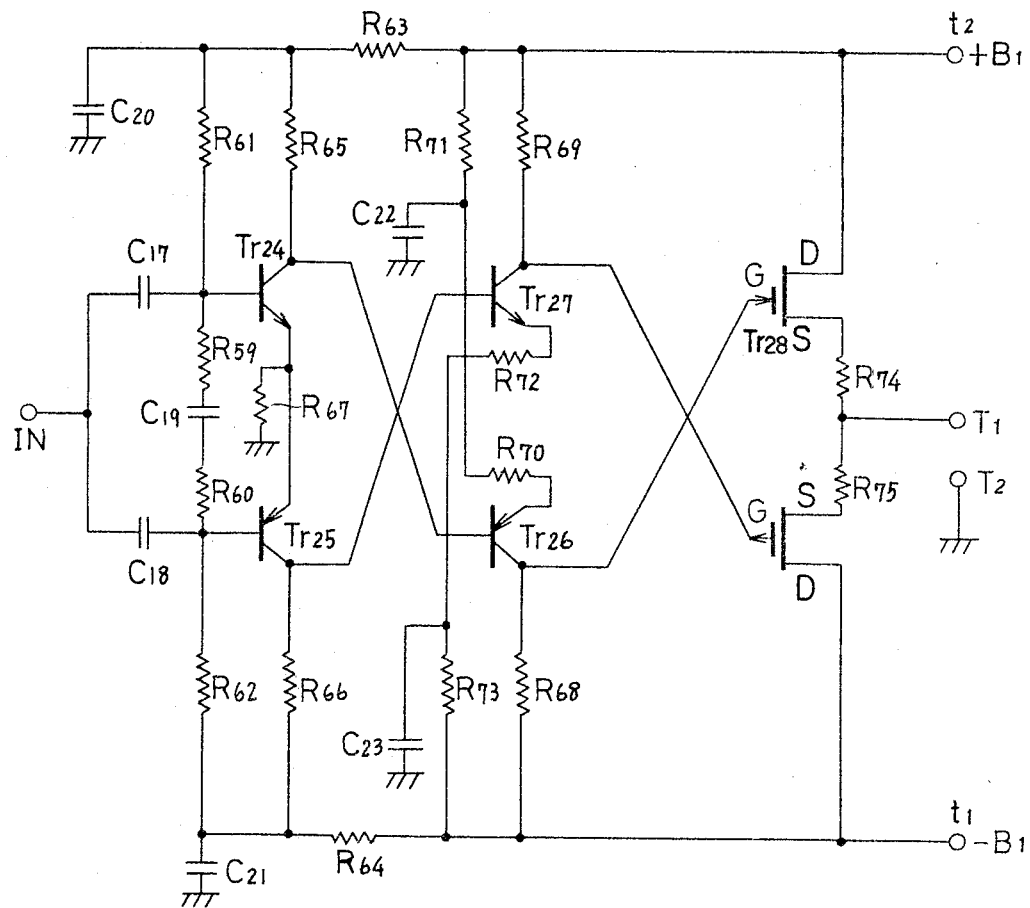
FIG. 7 is a circuit diagram showing a sixth embodiment of the audio power amplifier according to the invention.

FIG. 7 shows a sixth embodiment of the invention. In the Figure, reference symbol IN designates an input terminal, to which an audio frequency signal is coupled. The input terminal IN is connected through a capacitor $C_{17}$ to the base of a transistor $Tr_{14}$ and also through a capacitor $C_{18}$ to the base of a transistor $Tr_{25}$.

Between the bases of both the transistors $Tr_{24}$ and $Tr_{25}$ is connected series circuit consisting of resistor $R_{59}$, capacitor $C_{19}$ and resistor $R_{60}$. The base of the transistor $Tr_{24}$ is also connected through resistors $R_{61}$ and $R_{63}$ in series with each other to terminal $t_2$, the connection point between the resistors $R_{61}$ and $R_{63}$ being connected through a capacitor $C_{20}$ to earth. The base of the transistor $Tr_{25}$ is connected through series resistors $R_{62}$ and $R_{64}$ to terminal $t_1$, the connection point between the resistors $R_{62}$ and $R_{64}$ being connected through a capacitor $C_{21}$ to earth.

The transistors $Tr_{24}$ and $Tr_{25}$ have their emitters commonly connected through a resistor $R_{67}$ to earth.

The collector of the transistor $Tr_{24}$ is connected through a resistor $R_{65}$ to the juncture between the resistors $R_{61}$ and $R_{63}$, and the collector of the transistor $Tr_{25}$ is connected through a resistor $R_{66}$ to the juncture between the resistors $R_{62}$ and $R_{64}$. The n-p-n transistor $Tr_{24}$ and p-n-p transistor $Tr_{25}$ connected in complementary symmetry in this way constitute a first-stage voltage amplifier circuit.

The collector of the transistor $Tr_{24}$ is also connected directly to the base of a transistor $Tr_{26}$, and the collector of the transistor $T_{25}$ is also connected directly to the base of the transistor $Tr_{27}$.

The collector of the transistor $Tr_{26}$ is connected through a resistor $R_{68}$ to the terminal $t_1$, and the collector of the transistor $Tr_{27}$ is connected through a resistor $R_{69}$ to the terminal $t_2$.

The emitter of the transistor $Tr_{26}$ is connected through resistors $R_{70}$ and $R_{71}$ in series with each other to the terminal $t_2$, the connection point between the resistors $R_{70}$ and $R_{71}$ being connected through a capacitor $C_{22}$ to earth.

Likewise, the emitter of the transistor $Tr_{27}$ is connected through resistors $R_{72}$ and $R_{73}$ in series with each other to the terminal $t_1$, the connection point between the resistors $R_{72}$ and $R_{73}$ being connected through a capacitor $C_{23}$ to earth.

The p-n-p transistor $Tr_{26}$ and n-p-n transistor $Tr_{27}$ connected in complementary symmetry in this way constitute a second-stage amplifier circuit serving both as phase inversion stage and drive stage.

The collector of the transistor $Tr_{26}$ is also connected to the gate of an n-channel power FET $Tr_{28}$ having triode characteristics, and the collector of the transistor $Tr_{27}$ is also connected to the gate of a p-channel power FET $Tr_{29}$ having triode characteristics.

The power FET $Tr_{28}$ has its drain connected to the terminal $t_2$ and its source connected through a resistor $R_{74}$ to output terminal $T_1$, and the power FET $Tr_{29}$ has its source connected through a resistor $R_{75}$ to the output terminal $T_1$ and its drain connected to the terminal $t_1$. The power FET's $Tr_{28}$ and $Tr_{29}$ connected in complementary symmetry in this way and both having triode characteristics constitute a last-stage push-pull power amplifier circuit.

With the audio power amplifier of the above construction, an audio frequency signal coupled to the input terminal IN goes through the capacitors $C_{17}$ and $C_{18}$ to the base of the respective transistors $Tr_{24}$ and $Tr_{25}$ constituting the first voltage amplifier stage for voltage amplification.

The output signals appearing from the collector of the respective transistors $Tr_{24}$ and $Tr_{25}$ is coupled to the base of the respective transistors $Tr_{26}$ and $Tr_{27}$ for further voltage amplification and phase inversion.

The phase inversion output signals appearing from the collector of the transistors $Tr_{26}$ and $Tr_{27}$ is coupled as drive signal to the gate of the respective power FET's $Tr_{28}$ and $Tr_{29}$.

The output of the power amplifier stage consisting of the power FET's $Tr_{28}$ and $Tr_{29}$ is taken out as output signal from the outpt terminal $T_1$.

This output is less subject to odd harmonic distortions because the power FET's $Tr_{28}$ and $Tr_{29}$ constituting the power amplifier stage have characteristics similar to those of a triode vacuum tube. The reduction of the odd harmonic distortions is further enhanced with the complementary symmetry connection of all the first to last amplifier stages, so that sound of very high quality can be reproduced from a loudspeaker connected between the output terminals $T_1$ and $T_2$.

Figure 8:
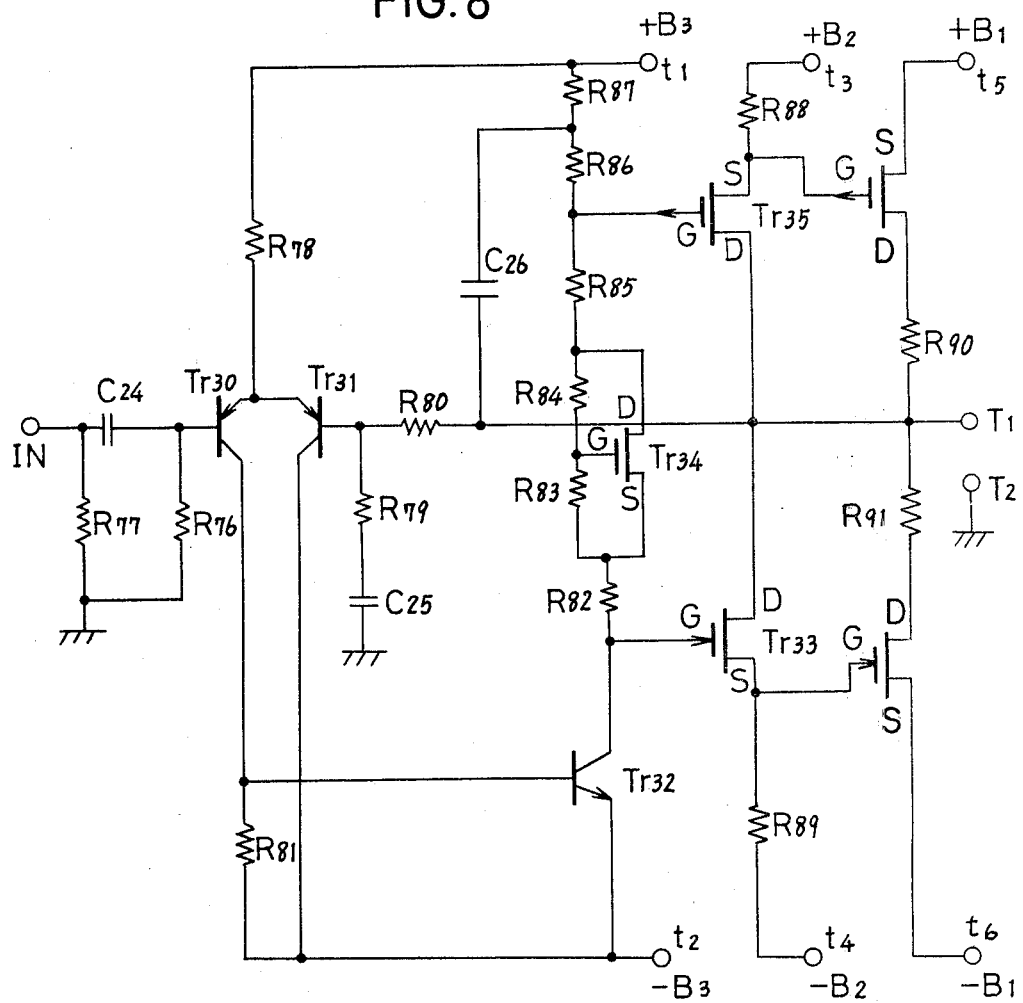
FIG. 8 is a circuit diagram showing a seventh embodiment of the audio power amplifier according to the invention.

FIG. 8 shows a seventh embodiment of the invention. In the Figure, reference numeral IN designates an input terminal, to which an audio frequency signal is coupled, and which is connected through a capacitor $C_{24}$ to the base of a transistor $Tr_{30}$. The input terminal IN and the base of the transistor $Tr_{30}$ are also connected through respective resistors $R_{76}$ and $R_{77}$ to earth.

The emitter of the transistor $Tr_{30}$ is directly connected to the emitter of a transistor $Tr_{31}$, and the common emitter connection is connected through a resistor $R_{78}$ to a terminal $t_1$, which is held at a potential $+B_3$.

As is shown, the transistor $Tr_{30}$ and $Tr_{31}$ form a differential amplifier constituting a first-stage voltage amplifier circuit.

The base of the transistor $Tr_{31}$ is connected through resistor $R_{79}$ and capacitor $C_{25}$ in series with each other to earth, and it is also connected through a resistor 80 to output terminal $T_1$ for negative feed-back.

The transistor $Tr_{30}$ has its collector connected through a resistor $R_{81}$ to a terminal $t_2$, which is held at a potential $-B_3$. The transistor $Tr_{31}$ has its collector directly connected to the terminal $t_2$.

The collector of the transistor $Tr_{30}$ is also connected to the base of a transistor $Tr_{32}$ which is provided for amplification. The transistor $Tr_{32}$ has its emitter connected to the terminal $t_2$ and its collector connected to the gate of a power FET $Tr_{33}$ having triode characteristics and described hereinafter. The collector of the transistor $Tr_{32}$ is also connected through a series circuit of resistors $R_{82}$ to $R_{87}$ to the terminal $t_1$. The connection point between the resistors $R_{85}$ and $R_{86}$ is connected to the gate of an FET $Tr_{35}$ having triode characteristics. The connection point between the resistors $R_{83}$ and $R_{84}$ is connected to the gate of an FET $Tr_{34}$ which is provided for temperature compensation. The FET $Tr_{34}$ has its source connected to the juncture between the resistors $R_{82}$ and $R_{83}$ and its drain connected to the juncture between the resistors $R_{84}$ and $R_{85}$. The connection point between the resistors $R_{86}$ and $R_{87}$ is connected through a capacitor $C_{26}$ to output terminal $T_1$.

The FET $Tr_{33}$ is of an n-channel type, and the FET $Tr_{35}$ is of a p-channel type. The FET $Tr_{33}$ has its drain connected to the output terminal $T_1$ and its source connected through a resistor $R_{89}$ to a terminal $t_4$, and the FET $Tr_{35}$ has its drain connected to the output terminal $T_1$ and its source connected through a resistor $R_{88}$ to a terminal $t_3$. The terminals $t_3$ and $t_4$ are held at respective potentials $+B_2$ and $-B_2$. The power FET's $Tr_{33}$ and $Tr_{35}$ connected in complementary symmetry in this way constitute a drive stage.

The source of the FET $Tr_{33}$ is connected to the gate of a power FET $Tr_{36}$ having triode characteristics. The power FET $Tr_{36}$ has its drain connected through a resistor $R_{91}$ to the output terminal $T_1$ and its source connected to a terminal $t_6$. The source of the FET $Tr_{35}$ is connected to the gate of a power FET $Tr_{37}$ having triode characteristics. The power FET Tr$_{37}$ has its source connected to a terminal t$_5$ and its drain connected through a resistor R$_{90}$ to the output terminal T$_1$. The terminals t$_5$ and t$_6$ are held at respective potentials +B$_1$ and −B$_1$. The two power FET's Tr$_{36}$ and Tr$_{37}$ having triode characteristics and connected in complementary symmetry in this way constitute a final-stage power amplifier circuit, whose output appears between output terminals T$_1$ and T$_2$. As is apparent from the Figure, the power FET Tr$_{36}$ is of an n-channel type, and the power FET Tr$_{37}$ is of a p-channel type. The power FET Tr$_{36}$ is adapted to be driven by the output signal from the n-channel FET Tr$_{33}$ having triode characteristics, and the power FET Tr$_{37}$ is adapted to be driven by the output signal from the p-channel FET Tr$_{35}$ having triode characteristics.

With the audio power amplifier of the above construction, an audio frequency signal coupled to the input terminal IN goes through the capacitor C$_{24}$ to the base of the transistor Tr$_{30}$ for voltage amplification through the first-stage voltage amplifier circuit of the transistors Tr$_{30}$ and Tr$_{31}$.

The output of this stage appearing at the collector of the transistor Tr$_{30}$ is coupled to the base of the transistor Tr$_{32}$ for further amplification thereby.

The output appearing at the collector of the transistor Tr$_{32}$ is coupled directly to the gate of the drive stage FET Tr$_{33}$ having triode characteristics and also coupled through the resistors R$_{82}$ and R$_{85}$ to the gate of the other drive stage FET Tr$_{35}$ also having triode characteristics.

In this way, the output signal from the transistor Tr$_{32}$ is amplified and phase inverted through the FET's Tr$_{33}$ and Tr$_{35}$ having triode characteristics, so that phase inversion output signals appear at the source of the FET Tr$_{33}$ and source of the FET Tr$_{35}$.

These output signals are coupled as drive signal to the gate of the respective power FET's Tr$_{36}$ and Tr$_{37}$ constituting the last-stage power amplifier circuit for power amplification of the preceding stage output.

The output of the power amplifier circuit of the power FET's Tr$_{36}$ and Tr$_{37}$ is taken out as output signal from the output terminal T$_1$.

The power amplified audio frequency signal thus obtained from the power amplifier circuit is less subject to odd harmonic distortions because the drive stage and output stage each consist of pair FET's having triode characteristics and connected in complementary symmetry form, so that sound of very high quality can be produced from a loudspeaker connected between the output terminals T$_1$ and T$_2$.

Figure 9:
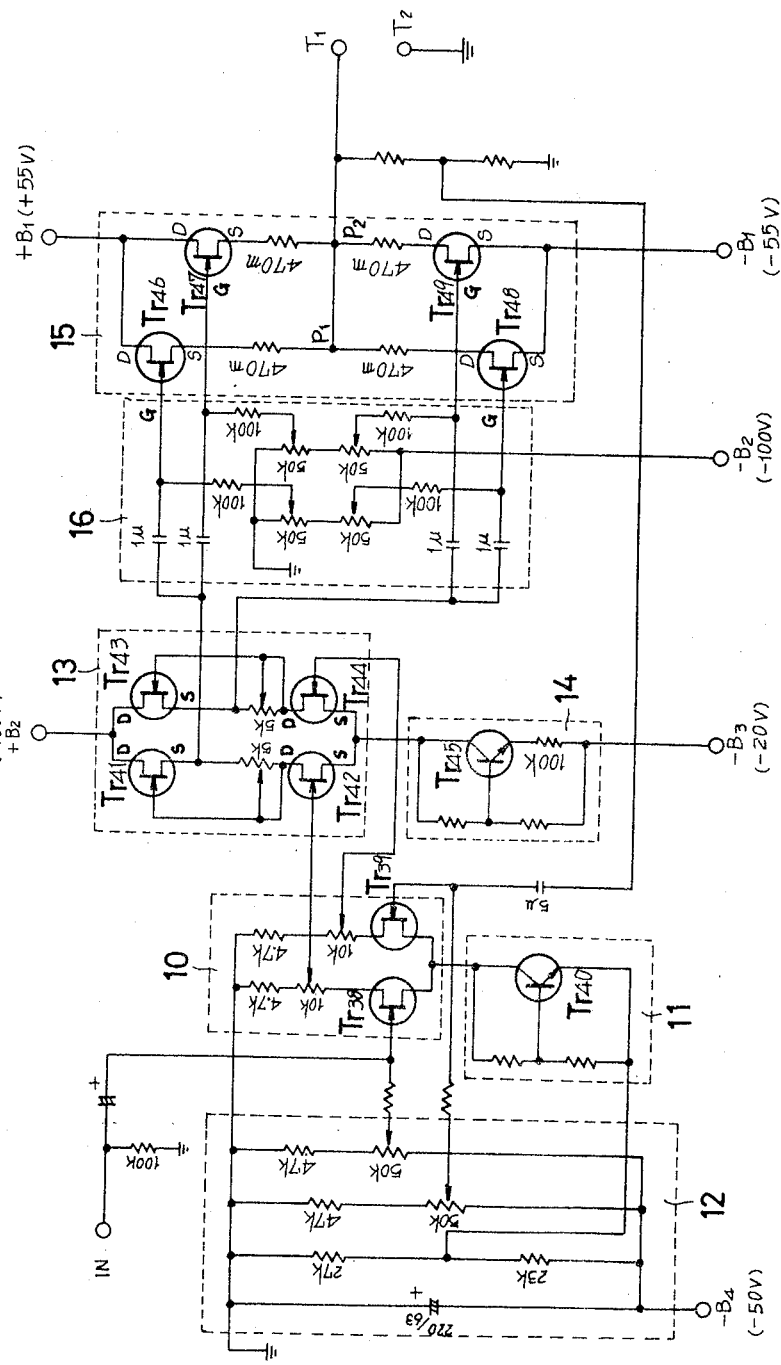
FIG. 9 is a circuit diagram illustrating an example of audio power amplifier of the invention.

FIG. 9 shows an example of audio power amplifier in this invention, a differential amplifier circuit 10 amplies audio frequency signal and the differential amplifier circuit 10 is composed of two N-channel FET's Tr$_{38}$ and Tr$_{39}$.

A constant-current circuit 11 constantly controlling the electric current supplied to the said differential amplifier circuit 10 consists of transistors Tr$_{40}$.

A circuit 12 determines the bias of FET's Tr$_{38}$ Tr$_{39}$ of the said differential amplifier circuit 10 and of transistor Tr$_{40}$ of the said constant-current circuit 11.

A shunt regulated push-pull circuit 13 comprising drive stage is composed of four N-channel FET's Tr$_{41}$–Tr$_{44}$ and its input side is connected to the output side of said differentiate amplifier circuit 10.

A constant-current circuit 14 constantly controlling the electric current supplied to said shunt regulated push-pull circuit 13 consists of transistor Tr$_{48}$.

A parallel push-pull circuit 15 comprising power amplifier stage is consists of four power FET's Tr$_{46}$–Tr$_{49}$ having triode characteristics.

A circuit 16 determining gate bias of respective power FET's Tr$_{46}$–Tr$_{49}$ is connected to the point between the input side of said parallel push-pull circuit 15 and the output side of said shunt regulated push-pull circuit 13. In the said power amplifier stage, the connection point P$_1$ between the source of power FET Tr$_{46}$ and the drain of power FET Tr$_{48}$ is connected to the connection point P$_2$ between the source of power FET Tr$_{47}$ and the drain of power FET Tr$_{49}$. Either of these connection points P$_1$ or P$_2$ is connected to the output terminal T$_1$.

Figure 10:
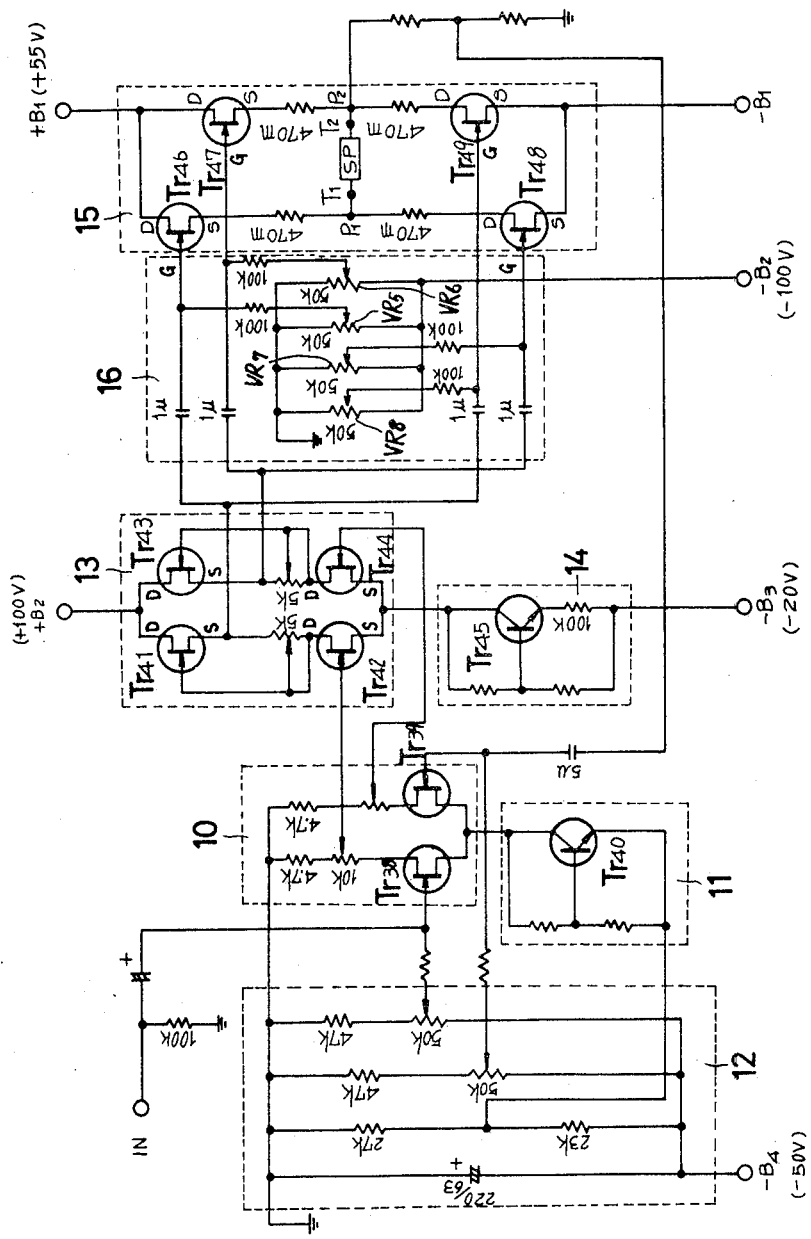
FIG. 10 is a circuit diagram illustrating a further example of audio power amplifier of the invention.

FIG. 10 shows an example of modifications of the power amplifier stage and the circuit 16 that determines the bias shown in FIG. 9. This power amplifier circuit 15 connecting four power FET's Tr$_{46}$–Tr$_{49}$ having triode characteristics in bridge fashion has a output terminal T$_1$ at the connection point P$_1$ connecting the source S of power FET Tr$_{46}$ and the drain D of power FET Tr$_{48}$ and (has) a terminal T$_2$ at the connection point P$_2$ connecting the source S of power FET Tr$_{47}$ and the drain of power FET Tr$_{49}$, and between these terminals T$_1$ and T$_2$ a loudspeaker 17 is connected. Thus power amplifier circuit 15 constitutes balanced transformer less.

Further, the gate G of power FET's Tr$_{46}$ and Tr$_{49}$ in the paid power amplifier circuit is connected between the source of FET Tr$_{41}$ and the drain of FET Tr$_{42}$ in said shunt regulated push-pull circuit 13.

The gate G of power FET's Tr$_{47}$ and Tr$_{48}$ is connected between the source of FET Tr$_{43}$ and the drain of FET Tr$_{44}$ in the said shunt regulated push-pull circuit 13, and the respective gate bias of respective power FET's Tr$_{46}$–Tr$_{49}$ is constituted respectively by variable resisters VR$_5$–VR$_8$ that are parallel with each other.

A latitude of modification, substitution and change is intended in the foregoing disclosure, and in some instances, some features of the present invention may be employed without a corresponding use of other features.

I claim:

1. An audio power amplifier comprising a first-stage voltage amplifier circuit of differential amplifier type including a pair of field-effect transistors for voltage amplifying an audio frequency signal, a second-stage voltage amplifier circuit including a field effect transistor for voltage amplifying the output signal from said first-stage voltage amplifier circuit, said second-stage voltage amplifier circuit also serving as a drive stage, and a last-stage power amplifier circuit including a pair of field-effect transistors having drain voltage versus drain current characteristics similar to static plate voltage versus plate current characteristics of a triode vacuum tube for power amplifying the output signals of said second-stage voltage amplifier circuit.

2. An audio power amplifier comprising:
   a first-stage amplifier circuit for amplifying an audio frequency signal,
   a second-stage amplifier circuit including an n-p-n transistor and a p-n-p transistor, said transistors being connected in complementary symmetry form for phase inverting the output signal of said first-stage amplifier circuit, said second-stage amplifier circuit also serving as a drive stage, and a last-stage power amplifier circuit including a pair of p-channel and n-channel power field-effect transistors having drain voltage versus drain current characteristics similar to static plate voltage versus plate current characteristics of a triode vacuum tube and connected in complementary symmetry form for power amplifying output signals from said second-stage amplifier circuit, the output signal from said second-stage n-p-n transistor being connected to drive said p-channel power field-effect transistor having triode characteristics, the output signal from said p-n-p transistor being connected to drive said n-channel power field-effect transistor having triode characteristics.

3. The audio power amplifier according to claim 2, wherein said first-stage amplifier circuit for amplifying an audio frequency signal consists of an operational amplifier.

4. The audio power amplifier according to claim 2, wherein said first-stage amplifier circuit for amplifying an audio frequency signal is a differential amplifier including a pair of transistors.

5. An audio power amplifier comprising a first-stage amplifier circuit including an n-p-n transistor and p-n-p transistor, said transistors being connected in complementary symmetry form for amplifying an audio frequency signal, a second-stage amplifier circuit connected to the output side of said first-stage amplifier circuit including a second n-p-n transistor and a second p-n-p transistor, said second transistors being connected in complementary symmetry form, said second-stage amplifier circuit also serving as a drive stage, and a last-stage power amplifier circuit including a p-channel power field-effect transistor and a n-channel power field-effect transistor, said field-effect transistors having drain voltage versus drain current characteristics similar to static plate voltage versus plate current characteristics of a triode vacuum tube and being connected in complementary symmetry form for amplifying output signals of said second-stage amplifier circuit, the output signal from said second n-p-n transistor being connected to drive said p-channel power field-effect transistor, the output signal from said second p-n-p transistor being connected to drive said n-channel power field-effect transistor.

6. An audio power amplifier comprising:
a first-stage amplifier circuit for amplifying an audio frequency signal,
a second-stage amplifier circuit including a p-channel field-effect transistor and an n-channel field-effect transistor,
said field-effect transistors having drain voltage versus drain current characteristics similar to static plate voltage versus plate current characteristics of a triode vacuum tube and being connected in complementary symmetry form for amplifying the output signal from said first-stage amplifier circuit, and
a last-stage power amplifier circuit including a p-channel power field-effect transistor and an n-channel power field-effect transistor both having drain voltage versus drain current characteristics similar to static plate voltage versus plate current characteristics of a triode vacuum tube and being connected in complementary symmetry form for power amplifying output signals from said second-stage amplifier circuit,
the output signal from said second-stage p-channel field-effect transistor being connected to drive only said p-channel power field-effect transistor, and
the output signal from said second-stage n-channel field-effect transistor being connected to drive only said n-channel power field-effect transistor.

* * * * *